United States Patent
Jiang et al.

(10) Patent No.: US 7,749,477 B2
(45) Date of Patent: Jul. 6, 2010

(54) CARBON NANOTUBE ARRAYS

(75) Inventors: Kai-Li Jiang, Beijing (CN); Kai Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/317,148

(22) Filed: Dec. 19, 2008

(65) Prior Publication Data
US 2009/0215651 A1    Aug. 27, 2009

Related U.S. Application Data

(62) Division of application No. 11/404,523, filed on Apr. 14, 2006, now Pat. No. 7,615,205.

(30) Foreign Application Priority Data

Apr. 15, 2005  (CN)  .................... 2005 1 0034242

(51) Int. Cl.
*D01F 9/12* (2006.01)
*C23C 16/00* (2006.01)
*C40B 40/18* (2006.01)

(52) U.S. Cl. .................... 423/447.1; 427/249.1; 506/22; 977/742

(58) Field of Classification Search ............. 423/447.3; 427/249.1, 301; 977/742, 833; 506/22
See application file for complete search history.

(56) References Cited

U.S. PATENT DOCUMENTS

| | | | |
|---|---|---|---|
| 6,350,488 B1 * | 2/2002 | Lee et al. | 427/249.1 |
| 2002/0109086 A1 * | 8/2002 | Colbert et al. | 250/306 |
| 2003/0161950 A1 * | 8/2003 | Ajayan et al. | 427/249.1 |

* cited by examiner

*Primary Examiner*—Jessica L Ward
*Assistant Examiner*—Alexander Polyansky
(74) *Attorney, Agent, or Firm*—D. Austin Bonderer

(57) ABSTRACT

A carbon nanotube array includes a plurality of carbon nanotubes. Each of the carbon nanotubes has a plurality of line marks formed on each of the carbon nanotubes. The line marks transversely extend across the carbon nanotubes. The line marks of each of the carbon nanotubes are spaced apart from each other.

13 Claims, 6 Drawing Sheets

CARBON NANOTUBE ARRAYS

CROSS-REFERENCE TO RELATED APPLICATIONS

This application is a divisional application of U.S. Patent Application, entitled "CARBON NANOTUBE ARRAYS AND MANUFACTURING METHODS THEREOF" with application Ser. No. 11/404,523, filed on Apr. 14, 2006 which issued as a U.S. Pat. No. 7,615,205 and related to commonly-assigned applications, entitled "DEVICES FOR MANUFACTURING CARBON NANOTUBE ARRAYS" with U.S. application Ser. No. 11/404,522, filed on Apr. 14, 2006 which issued as a U.S. Pat. No. 7,563,411 and "METHODS FOR MEASURING GROWTH RATES OF CARBON NANOTUBES" with U.S. application Ser. No. 11/404,700, filed on Apr. 14, 2006 which issued as a U.S. Pat. No. 7,611,740, the content of the above-referenced applications is hereby incorporated by reference.

BACKGROUND

1. Field of the Invention

The invention relates generally to carbon nanotubes and manufacturing methods thereof and, more particularly, to a carbon nanotube array and a manufacturing method thereof.

2. Discussion of Related Art

Carbon nanotubes (also herein referred to as CNTs) are very small tube-shaped structures essentially having a composition of a graphite sheet in a tubular form. Carbon nanotubes have interesting and potentially useful electrical and mechanical properties and offer potential for various uses in electronic devices. Carbon nanotubes also feature extremely high electrical conductivity, very small diameters (much less than 100 nanometers), large aspect ratios (i.e. length/diameter ratios) (greater than 1000), and a tip-surface area near the theoretical limit (the smaller the tip-surface area, the more concentrated the electric field, and the greater the field enhancement factor). These features make carbon nanotubes ideal candidates for electron field emitters, white light sources, lithium secondary batteries, hydrogen storage cells, transistors, and cathode ray tubes (CRTs).

Generally, there are three methods for manufacturing carbon nanotubes. The first method is the arc discharge method, which was first discovered and reported in an article by Sumio Iijima, entitled "Helical Microtubules of Graphitic Carbon" (Nature, Vol. 354, Nov. 7, 1991, pp. 56-58). The second method is the laser ablation method, which was reported in an article by T. W. Ebbesen et al., entitled "Large-scale Synthesis of Carbon Nanotubes" (Nature, Vol. 358, 1992, pp. 220). The third method is the chemical vapor deposition (CVD) method, which was reported in an article by W. Z. Li, entitled "Large-scale Synthesis of Aligned Carbon Nanotubes" (Science, Vol. 274, 1996, pp. 1701).

In order to use the carbon nanotubes more widely and more effectively, it is necessary to implement a controlled growth of the carbon nanotubes with desired structural parameters. Thus, it is pressing to unravel an underlying growth mechanism of the carbon nanotubes. On the road toward unraveling the growth mechanisms of the carbon nanotubes, it is of vital importance to study the growth kinetics of the carbon nanotubes. The progress in the synthesis of a CNT array gave a convenience of studying the growth kinetics of the carbon nanotubes by measuring a height of the CNT array. This is because the CNT array is a self-ordered structure, and the carbon nanotubes of the CNT array are nearly parallel-aligned.

The above-mentioned arc discharge method and laser ablation method can't synthesize CNT arrays, while the above-mentioned CVD method can synthesize CNT arrays. However, when adopting the conventional CVD method to synthesize a CNT array, the difficulty is that people do not readily know when the carbon nanotubes start their growth and when the growth has ceased. Furthermore, people can't easily distinguish whether the carbon nanotubes are formed in the tip-growth mode or the root-growth mode. Still furthermore, the growth rates of the carbon nanotubes at different temperatures can't be readily measured.

What is needed, therefore, is a carbon nanotube array from which people can know when the carbon nanotubes start their growth and when the growth has ceased, be able to readily distinguish the growth mode of the carbon nanotubes thereof, and can readily measure the growth rates of the carbon nanotubes at different temperatures.

What is also needed is a method for manufacturing the above-described carbon nanotube array.

SUMMARY

A carbon nanotube array includes a plurality of carbon nanotubes aligned in a uniform direction. Each carbon nanotube has at least one line mark formed thereon.

Other advantages and novel features of the present carbon nanotube array and the related manufacturing method will become more apparent from the following detailed description of preferred embodiments when taken in conjunction with the accompanying drawings.

BRIEF DESCRIPTION OF THE DRAWINGS

Many aspects of the present carbon nanotube array and the related manufacturing method can be better understood with reference to the following drawings. The components in the drawings are not necessarily to scale, the emphasis instead being placed upon clearly illustrating the principles of the present carbon nanotube array and the related manufacturing method.

Figure 1:
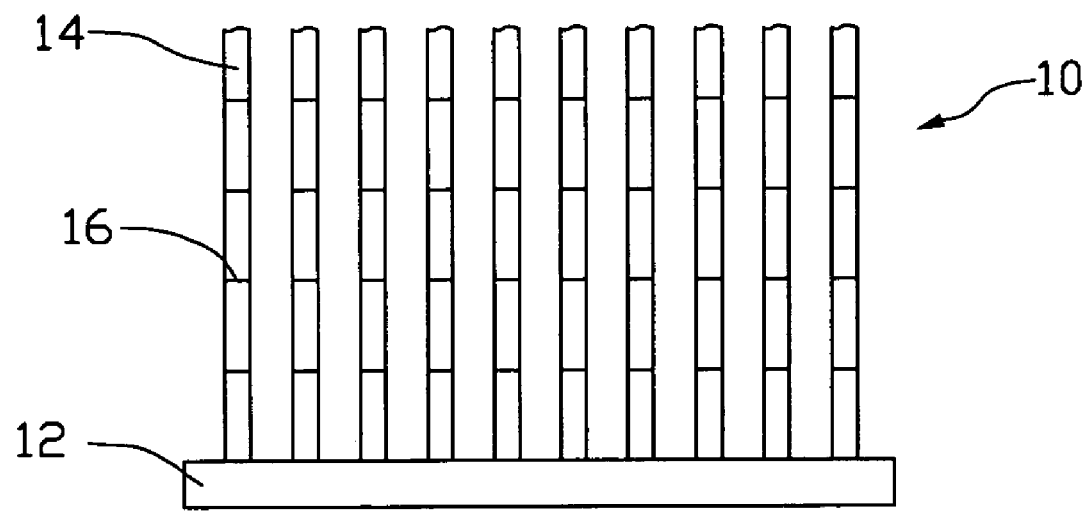
FIG. 1 is a schematic, side view of a carbon nanotube array in accordance with an exemplary embodiment of the present device, each carbon nanotube of the carbon nanotube array having a plurality of line marks formed thereon.

Corresponding reference characters indicate corresponding parts throughout the several views. The exemplifications set out herein illustrate at least one embodiment of the present carbon nanotube array and the related manufacturing method, in one form, and such exemplifications are not to be construed as limiting the scope of the invention in any manner.

DETAILED DESCRIPTION OF PREFERRED EMBODIMENTS

Reference will now be made to the drawings to describe embodiments of the present carbon nanotube array and the related manufacturing method thereof.

FIG. 1 is a schematic, side view of a carbon nanotube array 10, in accordance with an exemplary embodiment of the present device. As shown in FIG. 1, the carbon nanotube array 10 includes a substrate 12 and a plurality of carbon nanotubes 14 formed on the substrate 12. The carbon nanotubes 14 are aligned in a substantially uniform direction. In the preferred embodiment, the carbon nanotubes 14 are substantially perpendicular to the substrate 12. Each carbon nanotube 12 has a plurality of line marks 16 separately formed thereon, and the carbon nanotube 12 is thereby divided into several, readily recognizable segments.

Figure 2:
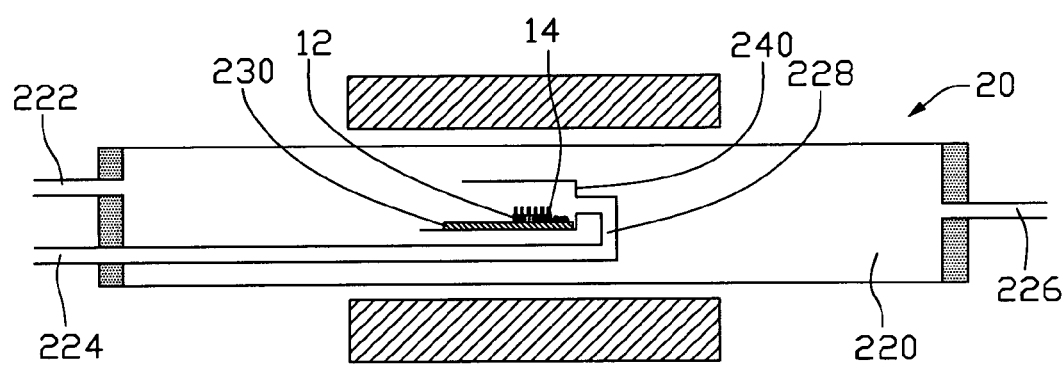
FIG. 2 is a schematic, side view of an exemplary device adopted for manufacturing the carbon nanotube array of FIG. 1.

FIG. 2 is a schematic, side view of an exemplary device 20 adopted for manufacturing the carbon nanotube array of FIG. 1. As shown in FIG. 2, the device 20 is a reaction furnace and includes a reaction chamber 220, a gas introducing tube 228, and a supporting component (i.e., quartz boat) 240. The reaction chamber 220 is a tubular container and is made of high-temperature resistant material having steady chemical properties (e.g., quartz, alumina, or another high-temperature ceramic). The reaction chamber 220 includes a first gas inlet 222, a second gas inlet 224, and a gas outlet 226. The first gas inlet 222 and the second inlet 224 extend through one end of the reaction chamber 220, and the gas outlet 226 extends through the other opposite end of the reaction chamber 220. The first gas inlet 222 is used to introduce a reaction gas and the second gas inlet 224 is used to introduce a disturbance gas.

The quartz boat 240 is disposed in the reaction chamber 220. The quartz boat 240 is used to carry the substrate 12 thereon. As shown in FIG. 2, the quartz boat 240 is semi-closed, and has one opening (not labeled) and one closed end (not labeled) opposite to the opening. The opening faces the first gas inlet 222. Alternatively, the quartz boat 240 can be cymbiform (i.e., boat-shaped), tabulate/planar, and so on. The gas introducing tube 228 is generally made of high-temperature resistant material having steady chemical properties (e.g., quartz, alumina, or another high-temperature ceramic). The gas introducing tube 228 includes a first end connected to the second gas inlet 224 and a second end, advantageously, connected to the quartz boat 240. The second end of the gas introducing tube 228 runs through the closed end of the quartz boat 240 or at least extends to an opening therein and is aimed at the substrate 12. A distance between the substrate 12 and the second end of the gas introducing tube 228 is as small as possible. The gas introducing tube 228 is used to transport the disturbance gas, introduced from the second gas inlet 224, to the quart boat 240. Alternatively, the second end of the second gas inlet 224 need not necessarily intersect and/or be directly connected to the quartz boat 240. What is required, however, is that the second end of the second gas inlet 224 is positioned sufficiently proximate to the substrate 12, carried by the quartz boat 240, to effectively deliver the disturbance gas thereto.

An exemplary method for manufacturing the carbon nanotube array 10 of FIG. 1 includes the following steps: (a) providing a substrate 12; (b) forming a catalyst layer on the substrate 12; (c) heating the substrate 12 to a predetermined temperature; and (d) intermittently introducing a reaction gas to grow a patterned carbon nanotube array 10 upon the catalyst layer.

In step (a), the substrate 12 is made of high-temperature resistant material having steady chemical properties, such as glass, quartz, silicon, or alumina.

Furthermore, a protection layer (e.g., silicon dioxide) can be formed on the substrate 12. A thickness of the protection layer is approximately in the range from 100 nanometers to 1000 nanometers. In the preferred embodiment, the substrate 12 is made of silicon. A protection layer made of silicon dioxide is formed on the silicon substrate 12. A thickness of the silicon dioxide is approximately in the range from 400 nanometers to 800 nanometers.

In step (b), the catalyst layer is uniformly disposed on the substrate 110 by means of, e.g., chemical vapor deposition, thermal deposition, electron-beam deposition, or sputtering. A thickness of the catalyst layer is in the approximate range from 1 nanometer to 10 nanometers. The catalyst layer is a whole. Alternatively, the catalyst layer is divided into a plurality of portions separated from each other by, for example, a UV lithography-sputtering-lift off process. This is beneficial to form the carbon nantobue array 10 with a uniform height. The catalyst layer can be made of iron (Fe), cobalt (Co), nickel (Ni), alloys thereof, or oxides including Fe, Co, and/or Ni. In the preferred embodiment, the catalyst layer is made of iron (Fe). A thickness of the iron layer is in the approximate range from 3 nanometers to 5 nanometers. In one embodiment, the catalyst layer is annealed at an approximate temperature in the range from 200° C. to 400° C. This is beneficial to obtain iron particles. The iron particles tend to enhance the catalysis.

Then, the substrate 12, with the iron particles disposed thereon, is placed in the reaction furnace 20. Furthermore, as shown in FIG. 2, a silica pad 230 is disposed in the quartz boat 240, and the substrate 12 with the iron particles disposed thereon is placed on the silica pad 230. The silica pad 230 is configured for facilitating the convenient removal of the substrate 12 out of the quartz boat 240 upon completion of processing. That is, the substrate 12 can be conveniently taken out of the quartz boat 240 by taking the silica pad 230 out of the quartz boat 240. Furthermore, the silica pad 230 is relatively flat and keeps the substrate 12 from engaging with the quartz boat 240 directly. This arrangement ensures that the substrate 12 is heated uniformly. This uniformity in heating is further beneficial to form the carbon nanotube array 10 with a uniform height.

In step (c), a temperature in the reaction furnace is approximately in the range from 500° C. to 900° C. In step (d), the intermittent introduction of the reaction gas is executed by repeating a process of providing the introduction of the reaction gas for a first predetermined time and interrupting the introduction of the reaction gas for a second predetermined time. The first predetermined time is approximately in the range from 1 minute to 5 minutes. The second predetermined time is approximately in the range from 10 seconds to 30 seconds.

Firstly, the first gas inlet 222 is open, and the reaction gas is introduced from the first gas inlet 222 and into the reaction chamber 220 for the first predetermined time. The reaction gas gets into the quartz boat 240 through the opening thereof to grow the array of carbon nanotubes 14 upon the substrate 12 via the catalyst layer. The reaction gas is a mixture of a carbon source gas and a protection gas. The protection gas is used to adjust a concentration of the carbon source gas. The carbon source gas can, for example, be ethylene ($C_2H_4$), methane ($CH_4$), acetylene ($C_2H_2$), or ethane ($C_2H_6$). The protection gas can be, e.g., argon (Ar) gas, nitrogen ($N_2$) gas, or hydrogen ($H_2$) gas. In the preferred embodiment, the carbon source gas is acetylene ($C_2H_2$) and the protection gas is argon (Ar) gas.

Then, the first gas inlet 222 is closed and the introduction of the reaction gas is switched off for the second predetermined time, thereby interrupting the flow of the reaction (i.e., carbon source) gas proximate the substrate. This would result a distinct line mark 16 on each as-grown carbon nanotube 14. In one embodiment, when the introduction of the reaction gas is switched off, a disturbance gas can be simultaneously introduced from the second gas inlet 224. The disturbance gas is transported into the quartz boat 240 through the gas introducing tube 228. The disturbance gas can be reductive gases and/or inert gases, such as argon (Ar) gas, nitrogen ($N_2$) gas, and hydrogen ($H_2$) gas. The disturbance gas can rapidly blow off the residual carbon source gas near the substrate 12, thus quickly halting the nanotube growth process. The described process of interrupting the introduction of the reaction gas (each such on/off cycle of the reaction gas, thereby corresponding to a growth cycle) is repeated a chosen number of times, and the carbon nanotube array 10 as shown in FIG. 1 is formed. Each carbon nanotube 14 of the carbon nanotube array 10 has a plurality of line marks 16 formed thereon, with the number of distinct sections within a given nanotube 14 corresponding to the number of growth cycles.

Alternatively, step (d) can be executed as follows. Firstly, the first gas inlet 222 is open, and the reaction gas is introduced from the first gas inlet 222 and into the reaction chamber 220 for the first predetermined time. The reaction gas gets into the quartz boat 240 through the opening thereof to grow the array of carbon nanotubes 14 from the substrate 12.

Then, the second gas inlet 224 is open, and a disturbance gas is introduced from the second gas inlet 224 for the second predetermined time. The disturbance gas can rapidly blow off the carbon source gas near the substrate 12, thereby interrupting the flow of the carbon source gas proximate the substrate. This would result a distinct mark 16 on each as-grown carbon nanotube 14. The described process of interrupting the introduction of the reaction gas (each such on/off cycle of the disturbance gas thereby corresponding to a growth cycle) is repeated a chosen number of times, and the carbon nanotube array 10 as shown in FIG. 1 is formed. Each carbon nanotube 14 of the carbon nanotube array 10 has a plurality of line marks 16 formed thereon. As can be seen from FIG. 3B, the marks 16 clearly indicate that there is a structural variant to the individual carbon nanotubes 14 at the area of the stop/start growing points. This variant can be seen on all of the carbon nanotubes 14 in the carbon nanotube array 10 by the line marks 16.

Figure 3A:
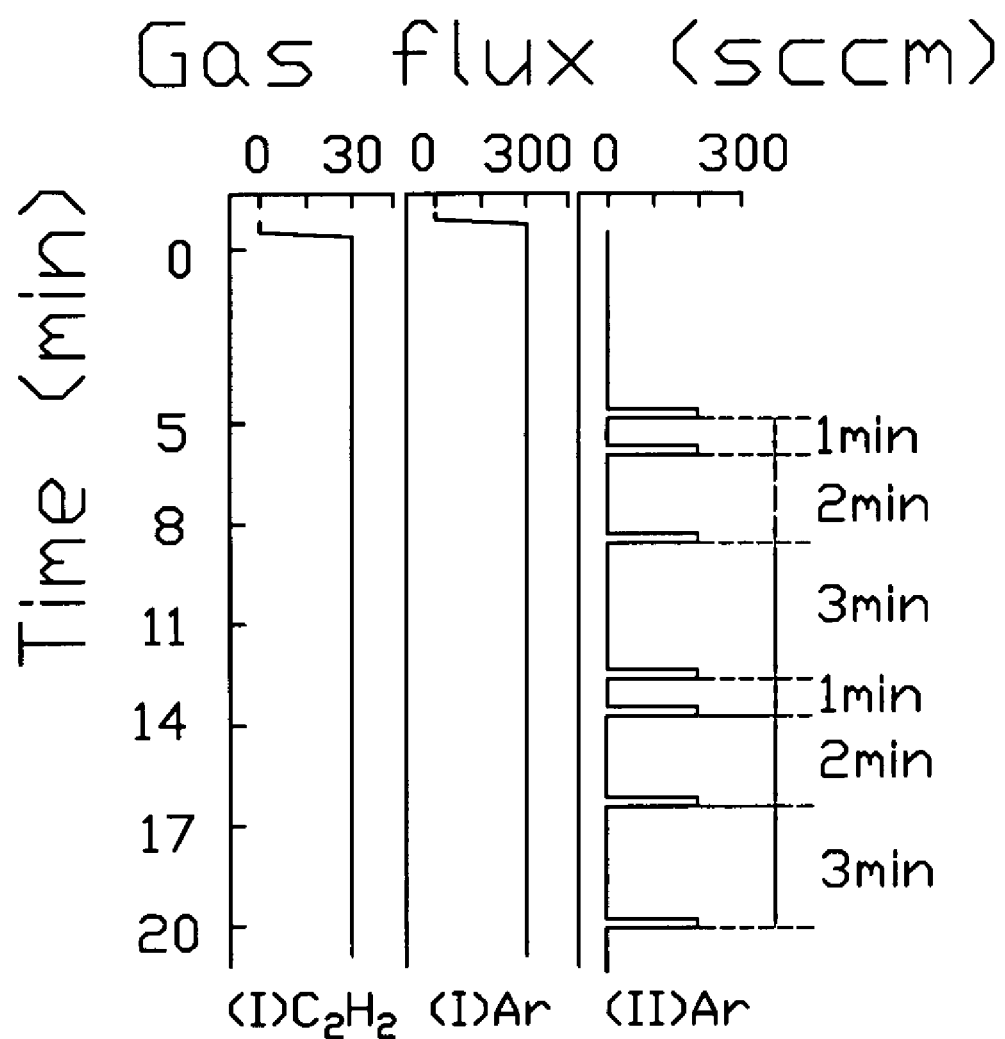
FIG. 3 includes a plot of gas flux versus time (FIG. 3A) in accordance with a first exemplary embodiment of the present method and a corresponding Scanning Electron Microscope (SEM) image (FIG. 3B) of the carbon nanotube array formed thereof.

A plot of gas flux versus time (FIG. 3A) in accordance with a first exemplary embodiment of the present method and a corresponding Scanning Electron Microscope (SEM) image (FIG. 3B) of the carbon nanotube array 10 formed thereof are shown. The growth temperature is about 933K, and the growth time is about seventeen minutes. Firstly, the first gas inlet 222 is open, and the reaction gas (i.e., a mixture of ethylene ($C_2H_4$) and argon (Ar) gas) is introduced from the first gas inlet 222 and into the reaction chamber 220 for about 5 minutes. Then, the second gas inlet 224 is open, and a disturbance gas (i.e., argon (Ar) gas) is introduced from the second gas inlet 224 and into the reaction chamber 220 for about 10 seconds. After that, the sequence is executed as follows: introducing the reaction gas for about 1 minute, introducing the disturbance gas for about 10 seconds, introducing the reaction gas for about 2 minutes, introducing the disturbance gas for about 10 seconds, introducing the reaction gas for about 3 minutes, introducing the disturbance gas for about 10 seconds, introducing the reaction gas for about 1 minute, introducing the disturbance gas for about 10 seconds, introducing the reaction gas for about 2 minutes, introducing the disturbance gas for about 10 seconds, introducing the reaction gas for about 3 minutes, and introducing the disturbance gas for about 10 seconds.

Figure 3B:
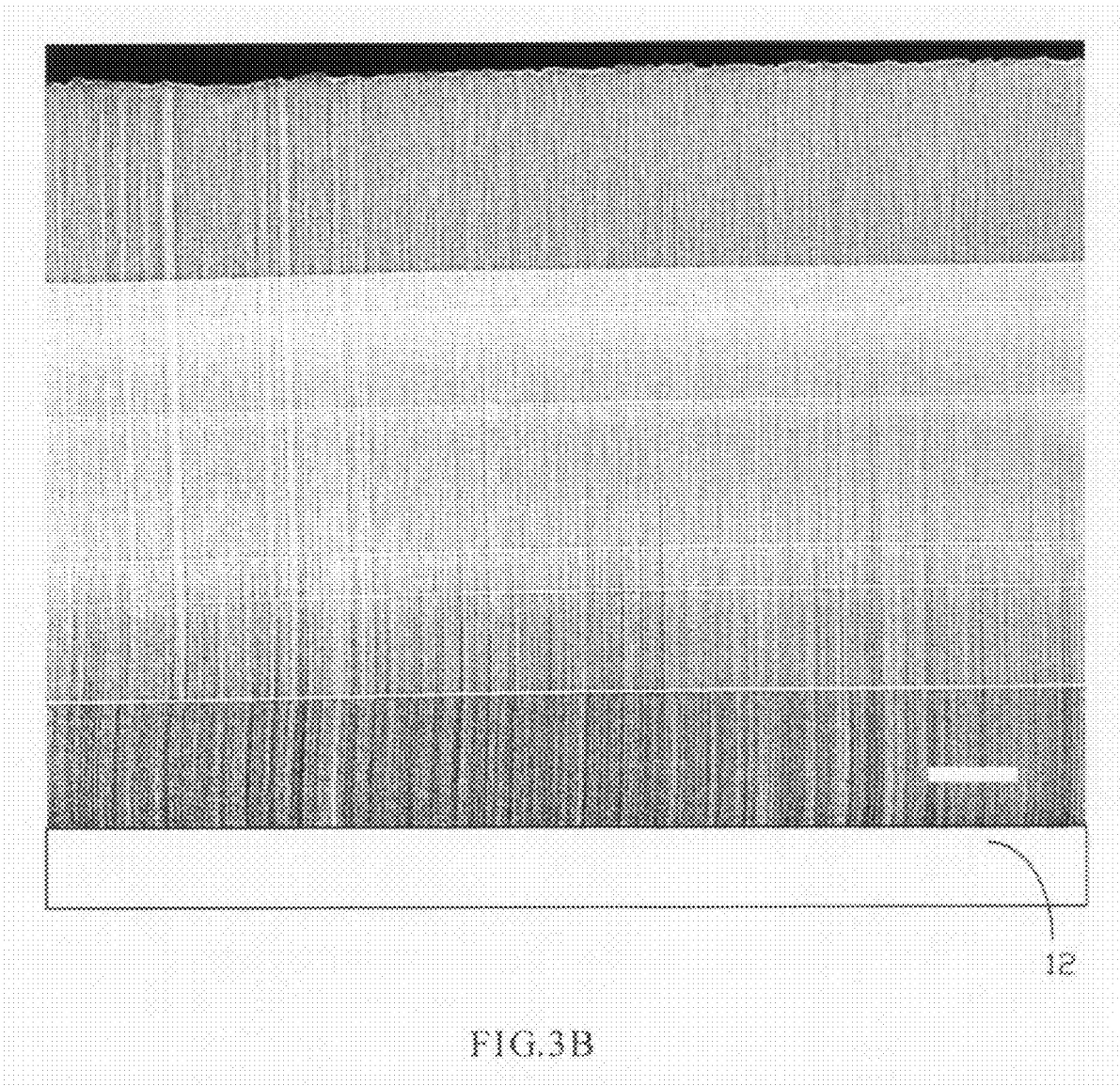

As shown in FIG. 3B, the resulting carbon nanotube array is divided into segments with different lengths by a series of parallel line marks. By matching theses segments with the mark sequence shown in FIG. 3A, it's unambiguously shown that growth points of the carbon nanotubes are at the bottom of the carbon nanotube array. That is, the carbon nanotubes are synthesized in the root-growth mode. Furthermore, the tops of the carbon nanotubes are the first grown parts. Further as shown in FIG. 3B, the last intended line mark does not appear. Thus, it can be concluded that the carbon nanotubes terminate their growth within the second 3-minute-growth interval.

The specific time when the carbon nanotubes start and cease growth are unknown. Thus, when measuring the growth rate of the carbon nanotubes, the first and last segments of the carbon nanotube array are neglected. The growth rate is equal to the length between a pair of line marks divided by the time interval between such two line marks.

Figure 4A:
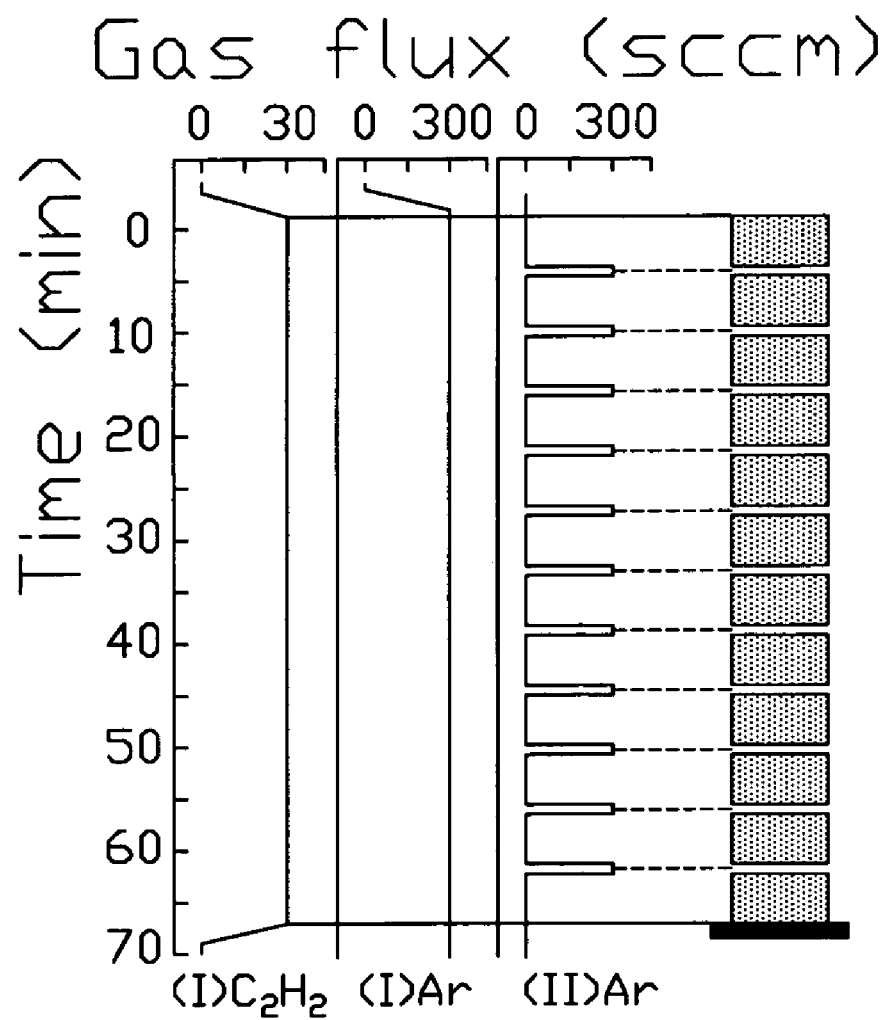
FIG. 4 includes a plot of gas flux versus time (FIG. 4A) in accordance with a second exemplary embodiment of the present method and a corresponding Scanning Electron Microscope (SEM) image (FIG. 4B) of the carbon nanotube array formed thereof.
Figure 4B:
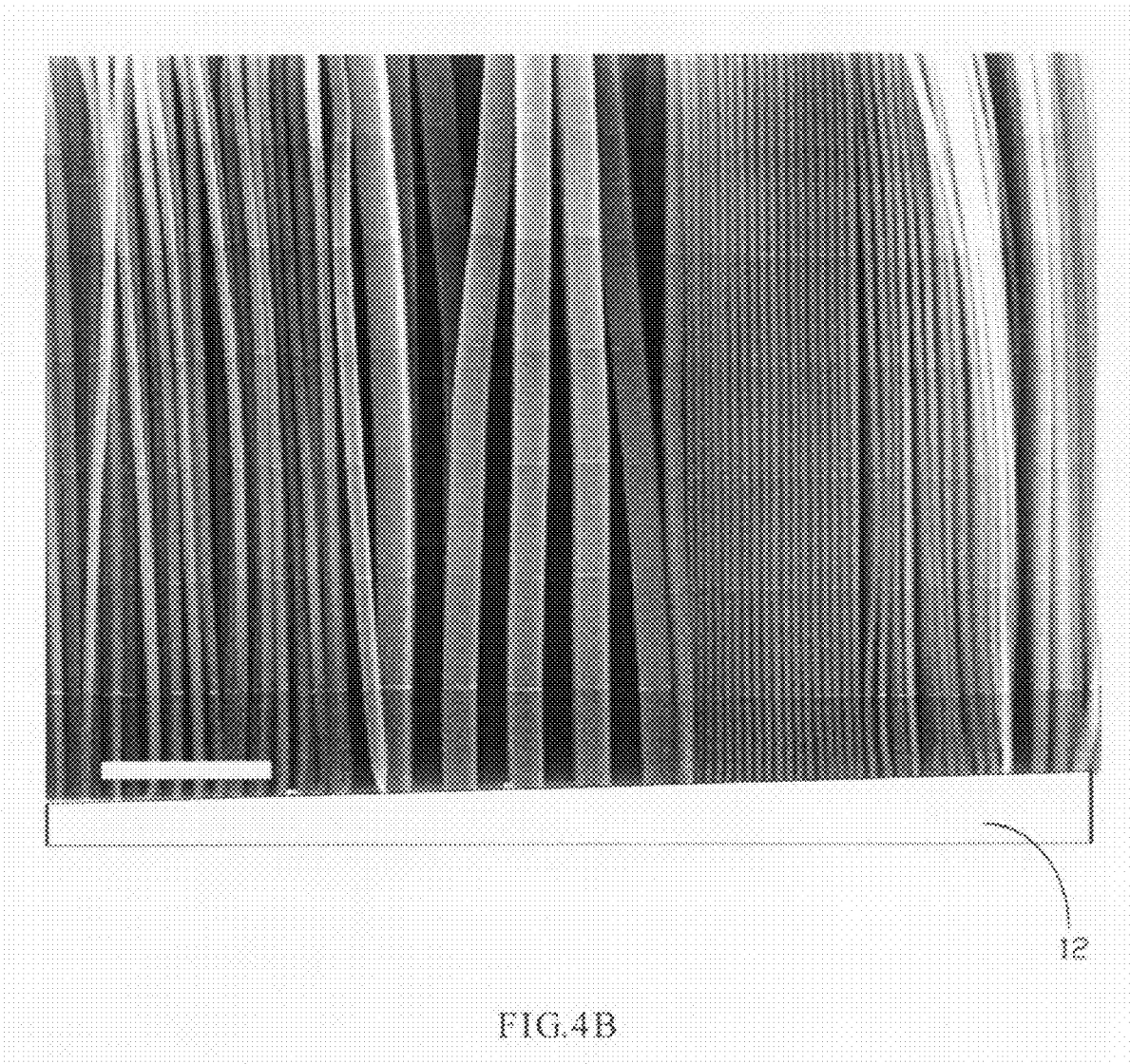

Alternatively, a plot of gas flux versus time (FIG. 4A) in accordance with a second exemplary embodiment of the present method and a corresponding Scanning Electron Microscope (SEM) image (FIG. 4B) of the carbon nanotube array 10 formed thereof are shown. The growth temperature is about 933K, and the growth time is about one hour. A disturbance gas (i.e., argon (Ar) gas) is introduced from the second gas inlet 224 and into the quartz boat 240 and near the substrate 12 about every 5 minutes. The total number of line marks is eleven. As shown in FIG. 4A, the as-grown carbon nanotube array should have twelve segments separated by the eleven line marks. However, as shown in FIG. 4B, the resulting carbon nanotube array actually has eight segments separated by seven line marks. That is, the carbon nanotubes terminate their growth within after the seventh and before the eighth mark time (i.e., the nanotubes stop growing within the eighth growth cycle).

The eight growth time cycles are substantially equal, and the lengths of the eight segments are substantially equal. Because the specified growth time in the first and last 5 minutes are uncertain, the first and last segments of the carbon nanotube array are neglected when measuring the growth rate of the carbon nanotubes. The growth rate is equal to the length between a pair of line marks divided by 5 minutes.

Compared with the conventional CVD method, the present method can be used to manufacture the CNT array with a plurality of line marks and thus distinct sections. From this CNT array, people can readily distinguish the carbon nanotubes are the root-growth mode. Furthermore, people can easily know when the carbon nanotubes start their growth and when the growth has ceased. Still furthermore, the growth rates of the carbon nanotubes at different temperatures can be readily measured.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:
1. A carbon nanotube array comprising:
a plurality of carbon nanotubes; and
at least one line mark formed on the carbon nanotubes, the
at least one line mark transversely extending across the
carbon nanotubes;

wherein the at least one line mark comprises a plurality of line marks transversely extending across the carbon nanotubes;

wherein the line marks are parallel to each other; and wherein the line marks are nonuniformly-spaced.

2. The carbon nanotube array as claimed in claim 1, wherein the at least one line mark is substantially a straight line.

3. The carbon nanotube array as claimed in claim 1, wherein the at least one line mark is substantially a continuous line.

4. The carbon nanotube array as claimed in claim 1, wherein parts of the carbon nanotubes located between every adjacent line mark have the same length.

5. The carbon nanotube array as claimed in claim 1, further comprising a metal layer formed on a common end of the carbon nanotubes.

6. The carbon nanotube array as claimed in claim 5, further comprising a substrate, the metal layer being disposed on a surface of the substrate and the carbon nanotubes being perpendicular to the surface of the substrate.

7. The carbon nanotube array as claimed in claim 6, wherein the line marks are parallel to the surface of the substrate.

8. A carbon nanotube array comprising:

a plurality of carbon nanotubes; and at least one line mark formed on the carbon nanotubes, the at least one line mark transversely extending across the carbon nanotubes;

wherein the at least one line mark comprises a plurality of line marks transversely extending across the carbon nanotubes; wherein each of the carbon nanotubes has a plurality of spaced marks distributed along an elongated direction of each of the carbon nanotubes and aligned with corresponding marks of adjacent carbon nanotubes to form the line marks.

9. The carbon nanotube array as claimed in claim 8, wherein the marks of each of the carbon nanotubes are orderly arranged along the elongated direction of the each of the carbon nanotubes.

10. The carbon nanotube array as claimed in claim 9, wherein the marks of each of the carbon nanotubes are uniformly-spaced along the elongated direction of the each of the carbon nanotubes.

11. A carbon nanotube comprising a plurality of marks, wherein the marks are regularly distributed along an elongated direction of the carbon nanotube; wherein each of the marks is a line extending along a transverse direction of the carbon nanotube.

12. The carbon nanotube as claimed in claim 11, wherein the marks are parallel.

13. The carbon nanotube as claimed in claim 12, wherein the marks are uniformly-spaced along the elongated direction of the carbon nanotube.

* * * * *